(12) United States Patent
Chatterjee et al.

(10) Patent No.: US 9,583,333 B2
(45) Date of Patent: Feb. 28, 2017

(54) LOW TEMPERATURE SILICON NITRIDE FILMS USING REMOTE PLASMA CVD TECHNOLOGY

(71) Applicant: Applied Materials, Inc., Santa Clara, CA (US)

(72) Inventors: Amit Chatterjee, Cupertino, CA (US); Abhijit Basu Mallick, Fremont, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 57 days.

(21) Appl. No.: 14/520,721

(22) Filed: Oct. 22, 2014

(65) Prior Publication Data
US 2015/0126045 A1 May 7, 2015

Related U.S. Application Data

(60) Provisional application No. 61/898,911, filed on Nov. 1, 2013.

(51) Int. Cl.
| | | |
|---|---|---|
| *H01L 21/02* | (2006.01) | |
| *C23C 16/34* | (2006.01) | |
| *C23C 16/44* | (2006.01) | |
| *C23C 16/452* | (2006.01) | |
| *C23C 16/455* | (2006.01) | |

(52) U.S. Cl.
CPC ........ *H01L 21/0217* (2013.01); *C23C 16/345* (2013.01); *C23C 16/4411* (2013.01); *C23C 16/452* (2013.01); *C23C 16/45582* (2013.01); *H01L 21/02211* (2013.01); *H01L 21/02219* (2013.01); *H01L 21/02222* (2013.01); *H01L 21/02274* (2013.01)

(58) Field of Classification Search
CPC ........................... C23C 16/345; C23C 16/452
See application file for complete search history.

(56) References Cited

U.S. PATENT DOCUMENTS

| | | | |
|---|---|---|---|
| 5,591,494 A | 1/1997 | Sato et al. | |
| 8,912,353 B2 * | 12/2014 | Xiao | C07F 7/025 556/410 |
| 2009/0095334 A1 | 4/2009 | Huston | |

(Continued)

OTHER PUBLICATIONS

Park et al., "Bulk and interface properties of low-temperature silicon nitride films deposited by remote plasma enhanced chemical vapor deposition," Journal of Materials Science: Materials in Electronics, Sep. 2001, vol. 12, Issue 9, pp. 515-522.*

(Continued)

*Primary Examiner* — Karen Kusumakar
(74) *Attorney, Agent, or Firm* — Patterson + Sheridan, LLP

(57) ABSTRACT

Embodiments of the present invention generally provide methods for forming a silicon nitride layer on a substrate. In one embodiment, a method of forming a silicon nitride layer using remote plasma chemical vapor deposition (CVD) at a temperature that is less than 300 degrees Celsius is disclosed. The precursors for the remote plasma CVD process include tris(dimethylamino)silane (TRIS), dichlorosilane (DCS), trisilylamine (TSA), bis-t-butylaminosilane (BT-BAS), hexachlorodisilane (HCDS) or hexamethylcyclotrisilazane (HMCTZ).

12 Claims, 1 Drawing Sheet

(56) References Cited

U.S. PATENT DOCUMENTS

| | | |
|---|---|---|
| 2011/0217851 A1* | 9/2011 | Liang .................. C23C 16/345 438/786 |
| 2012/0156894 A1 | 6/2012 | Wang et al. |
| 2013/0183835 A1 | 7/2013 | Nguyen et al. |
| 2013/0196516 A1 | 8/2013 | Lavoie et al. |
| 2013/0210241 A1 | 8/2013 | LaVoie et al. |

OTHER PUBLICATIONS

Stein et al., "Properties of Plasma-Deposited Silicon Nitride," J. Electrochem Soc.: Solid-State Science and Technology, Oct. 1979, vol. 126, No. 10, pp. 1750-1754.*

PCT Notification of Transmittal of the International Search Report and the Written Opinion of the International Searching Authority for International Application No. PCT/US2014/061822 dated Jan. 27, 2015; 13 total pages.

Park, et al.; Journal of Materials Science: Materials in Electronics; Bulk and Interface Properties of Low-Temperature Silicon Nitride Films Deposited by Remote Plasma Enhanced Chemical Vapor Deposition; 2 pages; 2001.

* cited by examiner

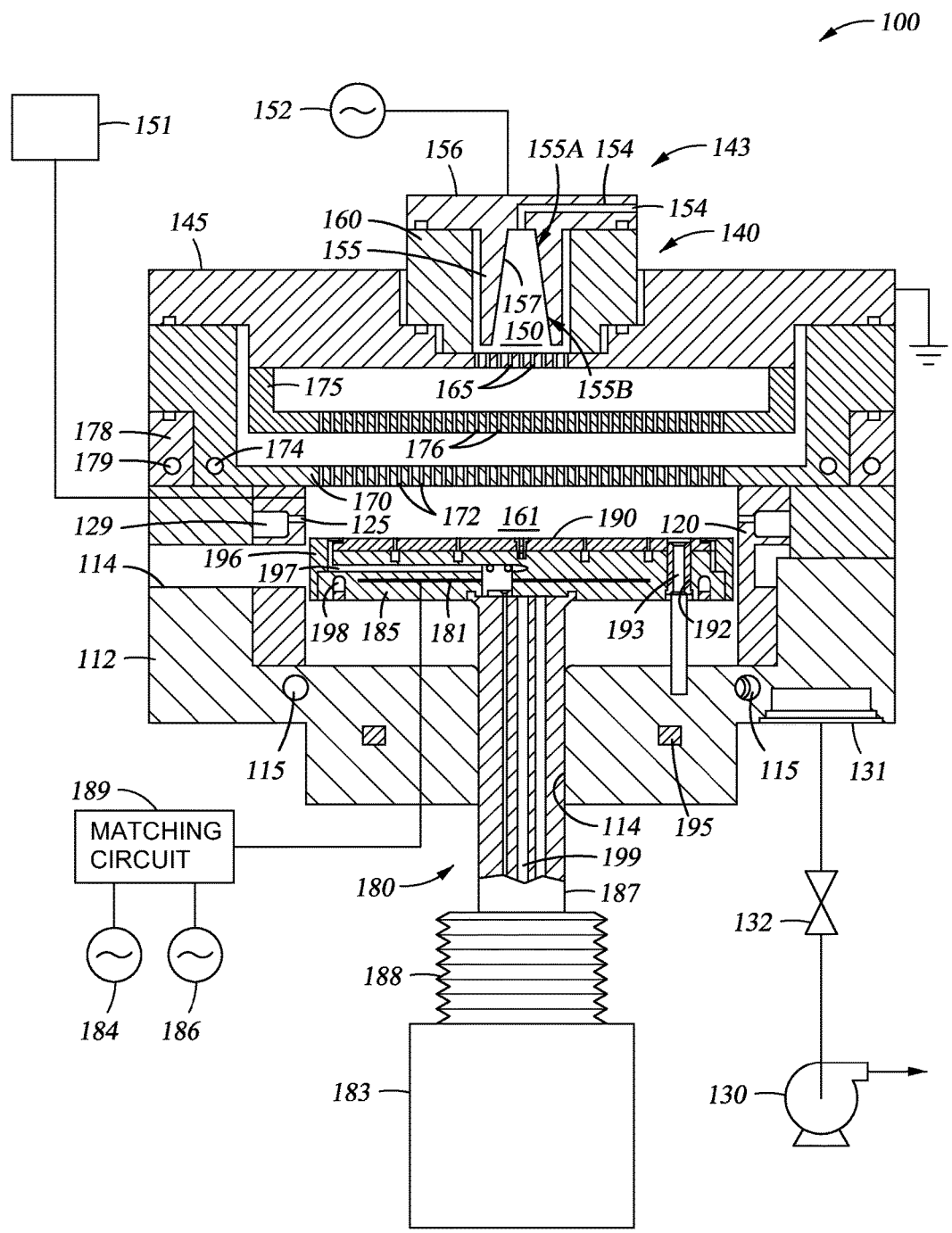

LOW TEMPERATURE SILICON NITRIDE FILMS USING REMOTE PLASMA CVD TECHNOLOGY

CROSS-REFERENCE TO RELATED APPLICATIONS

This application claims priority to U.S. Provisional Patent Application Ser. No. 61/898,911, filed on Nov. 1, 2013, which herein is incorporated by reference.

BACKGROUND

Field

Embodiments of the present invention generally relate to methods and processes for forming conformal silicon nitride films, including doped silicon nitride films, at low temperatures.

Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises.

For example, ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors. A CMOS transistor includes a gate structure that is disposed between a source region and a drain region defined in the semiconductor substrate. The gate structure (stack) generally comprises a gate electrode formed on a gate dielectric material.

Transistors may also be formed as 3 dimensional or 3D circuits as compared to traditional planar circuits. 3D transistors may employ gates that form conducting channels on three sides of a vertical "fin" structure, allowing chips to operate at lower voltage with lower leakage. Examples of three dimensional transistors having such gate structures include a FinFET (a nonplanar, double-gate transistor built on a silicon-on-insulator technology substrate, based on the earlier DELTA (single-gate) transistor design) or a Trigate transistor structure.

Conformal coverage with low pattern loading effect of dielectric films on high aspect ratio structures and/or 3D structures are of critical requirement as device node shrinks down to below 45 nm, such as to the 22 nm level, and as the manufacture of 3D transistors increases. Silicon nitride films, including doped silicon nitride, may be used throughout integrated circuit formation, such as gate spacers, liner layers, sacrificial layers, barrier layers, etc. Silicon nitride films formed using thermal processes offers good conformality. The drawbacks, however, include a high temperature requirement (typically greater than 400° C.) and few capabilities to engineer film compositions and properties for different applications. Alternatively, conventional silane-based plasma enhanced chemical vapor deposition (PECVD) silicon nitride films have poorer step coverage due to directionality of radicals' fluxes. Additionally, tuning conformal layers to have desired film properties has also been difficult, particularly as the feature size decreases and the use of non-planar structures increases.

Therefore, there is a need for a low temperature process to form conformal silicon nitride films with micromodulated texture, composition and stable film properties.

SUMMARY

Embodiments of the present invention generally provide methods for forming a silicon nitride layer on a substrate. In one embodiment, a method of forming a silicon nitride layer using remote plasma chemical vapor deposition (CVD) at a temperature that is less than 300 degrees Celsius is disclosed. The precursors for the remote plasma CVD process include tris(dimethylamino)silane (TRIS), dichlorosilane (DCS), trisilylamine (TSA), bis-t-butylaminosilane (BT-BAS), hexachlorodisilane (HCDS) or hexamethylcyclotrisilazane (HMCTZ).

In one embodiment, a method is disclosed. The method includes forming a silicon nitride layer on a substrate by a remote plasma chemical vapor deposition process at a deposition temperature less than 300 degrees Celsius, and the remote plasma chemical vapor deposition process utilizes a processing gas mixture, which includes tris(dimethylamino)silane, dichlorosilane, trisilylamine, di-t-butylaminosilane, hexachlorodisilane, or hexamethylcyclotrisilazane.

In another embodiment, a method is disclosed. The method includes forming a silicon nitride layer on a substrate by a remote plasma chemical vapor deposition process. The deposition temperature ranges from about 20 degrees Celsius to about 250 degrees Celsius, the remote plasma chemical vapor deposition process utilizes a processing gas mixture, which includes tris(dimethylamino)silane, dichlorosilane, trisilylamine, di-t-butylaminosilane, hexachlorodisilane, hexamethylcyclotrisilazane, argon or combination thereon, and the processing gas mixture is excited to form a plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a schematic cross-sectional view of an exemplary substrate processing system.

DETAILED DESCRIPTION

Embodiments of the present invention generally provide methods for forming a silicon nitride layer on a substrate. In one embodiment, a method of forming a silicon nitride layer using remote plasma chemical vapor deposition (CVD) at a temperature that is less than 300 degrees Celsius is disclosed. The precursors for the remote plasma CVD process include tris(dimethylamino)silane (TRIS), dichlorosilane (DCS), trisilylamine (TSA), bis-t-butylaminosilane (BT-BAS), hexachlorodisilane (HCDS) or hexamethylcyclotrisilazane (HMCTZ).

Conformality of a layer is typically quantified by a ratio (which may be represented as a percentage) of the average thickness of a layer deposited on the sidewalls of a feature to the average thickness of the same deposited layer on the field, or upper surface, of the substrate. Layers deposited by the methods described herein are observed to have a conformality of greater than about 90%, such as 95% or greater, to about 100%.

FIG. 1 is a cross-sectional view of an illustrative processing chamber 100 suitable for conducting a deposition process as further described below. The chamber 100 is configured to form a silicon nitride layer on a substrate surface. The chamber 100 is particularly useful for performing the remote plasma CVD process. One processing chamber 100 suitable for practicing the invention is a Frontier™ processing chamber which is available from Applied Materials, Santa Clara, Calif. It is noted that other vacuum processing chambers available from other manufactures may also be adapted to practice the present invention.

The processing chamber 100 provides both heating and cooling of a substrate surface without breaking vacuum. In one embodiment, the processing chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to an interior of the processing chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing. Control of the temperature of the chamber body 112 is important to prevent unwanted condensation of the gas or byproducts on the interior of the chamber body 112. Exemplary heat transfer fluids include water, ethylene glycol, or a mixture thereof. An exemplary heat transfer fluid may also include nitrogen gas.

The chamber body 112 can further include a liner 120 that surrounds the support assembly 180. The liner 120 is removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contamination of the processing chamber 100. In one or more embodiments, the liner 120 includes one or more apertures 125 and a pumping channel 129 formed therein that is in fluid communication with a vacuum port 131. The apertures 125 provide a flow path for gases into the pumping channel 129, which provides an egress for the gases within the processing chamber 100 to the vacuum port 131.

A vacuum system is coupled to the vacuum port 131. The vacuum system may include a vacuum pump 130 and a throttle valve 132 to regulate flow of gases through the processing chamber 100. The vacuum pump 130 is coupled to a vacuum port 131 disposed in the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143,145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that bounds the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable across the expanding section 155. The varying distance helps control the formation and stability of the plasma generated within the plasma cavity 150.

In one or more embodiments, the expanding section 155 resembles an inverted truncated cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. The variable distance is directly influences to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140. As the plasma generated in the plasma cavity 150 is defined in the lid assembly 140 prior to entering into a processing region above the support assembly 180 wherein the substrate is proceed, the lid assembly 140 is considered as a remote plasma source because the plasma is generated remotely from the processing region. The usage of remote plasma CVD has several benefits: plasma generation and film formation takes place in two different regions, deposition temperature is lowered, plasma is induced in a region free of source compound using a non-film forming gas, number of active species is substantially less, the chemistry of process can be predicted and controlled, and substrates and films are not damaged by bombarding charged particles.

Additional process/carrier gases may be introduced into the process region 161. These process/carrier gases are not excited to form a plasma and may be introduced into the process region 161 via a gas source 151.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150.

The lid assembly 140 can further include an isolator ring 160 that electrically isolates the first electrode 143 the second electrode 145. The isolator ring 160 can be made from aluminum oxide or any other insulative, process compatible material. The isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. A hinge assembly (not shown) can be used to couple the lid rim 178 to the chamber body 112. The lid rim 178 can include an embedded channel or passage 179 for circulating a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the processing region of the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat suitable transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 may optionally be disposed between the second electrode 145 and the distribution plate 170. The blocker plate 175 is removably mounted to a lower surface of the second electrode 145. The blocker plate 175 may be in good thermal and electrical contact with the second electrode 145. In one or more embodiments, the blocker plate 175 can be coupled to the second electrode 145 using a bolt or similar fastener. The blocker plate 175 can also be threaded or screwed onto an outer diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in FIG. 1) for processing within the chamber body 112. The support member 185 can be coupled to a lift mechanism 183 through a shaft 187 which extends through a centrally-located opening 114 formed in a bottom surface of the chamber body 112. The lift mechanism 183 can be flexibly sealed to the chamber body 112 by a bellows 188 that prevents vacuum leakage from around the shaft 187. The lift mechanism 183 allows the support member 185 to be moved vertically within the chamber body 112 between a process position and a lower transfer position. The transfer position is slightly below the slit valve opening 114 formed in a sidewall of the chamber body 112 so that the substrate may be robotically removed from the substrate support member 185.

In one or more embodiments, the support member 185 has a flat, circular surface or a substantially flat, circular surface for supporting a substrate to be processed thereon. The support member 185 may be constructed of aluminum. The support member 185 can include a removable top plate 190 made of some other material, such as silicon or ceramic material, for example, to reduce backside contamination of the substrate.

In one or more embodiments, the substrate (not shown) may be secured to the support member 185 using a vacuum chuck. In one or more embodiments, the substrate (not shown) may be secured to the support member 185 using an electrostatic chuck. An electrostatic chuck typically includes at least a dielectric material that surrounds an electrode 181, which may be located on the support member 185 or formed as an integral part of the support member 185. The dielectric portion of the chuck electrically insulates the chuck electrode 181 from the substrate and from the remainder of the support assembly 180.

In one embodiment, the electrode 181 is coupled to a plurality of RF power bias sources 184, 186. There may be one RF power bias source, while the other bias source is optional. The RF bias power sources 184, 186 provide RF power to the electrode 181 which excites and sustains a plasma discharge formed from the gases disposed in the processing region of the chamber body.

In the embodiment depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the plasma processing chamber 100, thereby providing ion energy necessary for performing a deposition, etch, or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The lift ring 195 is movable such that the upper surface of the lift pin 193 can be extended above the substrate support surface of the support member 185 when the lift ring 195 is in an upper position. Conversely, the upper surface of the lift pins 193 is located below the substrate support surface of the support member 185 when the lift ring 195 is in a lower position. Thus, each lift pin 193 is moved in its respective bore 192 in the support member 185 when the lift ring 195 moves from either the lower position to the upper position.

The support assembly 180 can further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. The purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185 and substrate disposed thereon. Any suitable heat transfer fluid may be used, such as water, nitrogen, ethylene glycol, or mixtures thereof. The support member 185 can further include an embedded thermocouple (not shown) for monitoring the temperature of the support surface of the support member 185, which is indicative of the temperature of the substrate disposed thereon. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100.

In operation, the support member 185 can be elevated to a close proximity of the lid assembly 140 to control the temperature of the substrate being processed. As such, the substrate can be heated via radiation emitted from the distribution plate 170. Alternatively, the substrate can be lifted off the support member 185 to close proximity of the heated lid assembly 140 using the lift pins 193 activated by the lift ring 195. The substrate is heated to less than 300 degrees Celsius during the deposition of silicon nitride film by remote plasma CVD process.

A system controller (not shown) can be used to regulate the operations of the processing chamber 100. The system controller can operate under the control of a computer program stored on a memory of a computer. The computer program may include instructions that enable the process described below to be performed in the processing chamber 100. For example, the computer program can dictate the process sequencing and timing, mixture of gases, chamber pressures, RF power levels, susceptor positioning, slit valve opening and closing, substrate cooling and other parameters of a particular process.

Aspects of the invention provide for low temperature conformal deposition of a silicon nitride ($Si_xN_y$) layer. Low temperature conformal deposition may be achieved by processes utilizing a processing gas mixture and excite the process gas mixture to form a plasma at a location remote from where the deposition is performed. For example, the plasma is formed in the plasma cavity 150 of the processing chamber 100.

The precursors may include one or more of the listed compounds, for example, TRIS, DCS, TSA, BTBAS, HCDS, or HMCTZ. Any of the precursor compounds may be used alone or in combination with other precursor compounds. The processing gas mixture may include other process gases besides the precursor gases such as carrier or other types of gases. For example, the other process gases may include inert gas such as Ar. In one embodiment, the deposition of silicon nitride involves Ar remote plasma and TSA. Ar breaks down to Ar radicals and breaks down Si—H bonds to form $(-Si-NH-)_x$ polymers. Deposition temperature may be between about 20 degrees Celsius (room temperature) and about 250 degrees Celsius. Deposition temperature is referred to the temperature of the substrate during the deposition. At room temperature, there is more residual hydrogen in the film resulting in lower refractive index (1.8). At higher deposition temperature such as greater than room temperature there is less residual hydrogen in the film resulting in higher refractive index (2.2). After depositing the silicon nitride film, various processes may be performed on the deposited film to remove the residual hydrogen, such as high density plasma treatment, UV cure, or ebeam cure etc. Thus, silicon nitride film having no residual hydrogen may be deposited at a temperature below 300 degrees Celsius by remote plasma CVD.

While the foregoing is directed to embodiments of the present invention, other and further embodiments of the invention may be devised without departing from the basic scope thereof, and the scope thereof is determined by the claims that follow.

The invention claimed is:

1. A method, comprising:
    forming a silicon nitride layer on a substrate in a processing region of a processing chamber by a remote plasma chemical vapor deposition process at a deposition temperature less than 300 degrees Celsius, wherein the remote plasma chemical vapor deposition process utilizes a processing gas mixture, wherein the processing gas mixture includes tris(dimethylamino)silane, di-t-butylaminosilane, or hexamethylcyclotrisilazane, and wherein the processing gas mixture is excited to form a plasma in a plasma cavity that is remote from the processing region, the plasma cavity is defined by a first electrode and a second electrode, and the first electrode and the second electrode are electrically isolated by an isolator ring.

2. The method of claim 1, wherein the deposition temperature ranges from about 20 degrees Celsius to about 250 degrees Celsius.

3. The method of claim 2, wherein the silicon nitride layer has a refractive index of 1.8 when the deposition temperature is about 20 degrees Celsius.

4. The method of claim 2, wherein the silicon nitride layer has a refractive index of 2.2 when the deposition temperature is higher than 20 degrees Celsius.

5. The method of claim 1, further comprising curing the silicon nitride layer.

6. The method of claim 5, wherein the curing the silicon nitride layer includes UV curing or ebeam curing.

7. The method of claim 1, wherein the processing gas mixture further includes a carrier gas.

8. A method, comprising:
    forming a silicon nitride layer on a substrate in a processing region of a processing chamber by a remote plasma chemical vapor deposition process, wherein the deposition temperature ranges from about 20 degrees Celsius to about 250 degrees Celsius, wherein the remote plasma chemical vapor deposition process utilizes a processing gas mixture, wherein the processing gas mixture includes tris(dimethylamino)silane, di-t-butylaminosilane, hexamethylcyclotrisilazane, argon or combination thereof, and wherein the processing gas mixture is excited to form in a plasma cavity that is remote from the processing region, the plasma cavity is defined by a first electrode and a second electrode, and the first electrode and the second electrode are electrically isolated by an isolator ring.

9. The method of claim 8, wherein the silicon nitride layer has a refractive index of 1.8 when the deposition temperature is about 20 degrees Celsius.

10. The method of claim 9, wherein the silicon nitride layer has a refractive index of 2.2 when the deposition temperature is higher than 20 degrees Celsius.

11. The method of claim 8, further comprising curing the silicon nitride layer.

12. The method of claim 11, wherein the curing the silicon nitride layer includes UV curing or e-beam curing.

* * * * *